United States Patent [19]
Maeda

[11] Patent Number: 5,909,128
[45] Date of Patent: Jun. 1, 1999

[54] FETS LOGIC CIRCUIT

[75] Inventor: Tadashi Maeda, Tokyo, Japan

[73] Assignee: NEC Corporation, Tokyo, Japan

[21] Appl. No.: 08/823,039

[22] Filed: Mar. 21, 1997

[30] Foreign Application Priority Data

Mar. 22, 1996 [JP] Japan ..................................... 8-093275

[51] Int. Cl.$^6$ .................. H03K 19/094; H03K 19/0952
[52] U.S. Cl. ............................. 326/116; 326/80; 326/112; 326/117; 327/538
[58] Field of Search ........................... 326/112, 116–117, 326/17, 68–69, 80, 33–34; 327/530, 538, 541, 543

[56] References Cited

FOREIGN PATENT DOCUMENTS 3-19422    1/1991    Japan .
6-104734   4/1994    Japan .

*Primary Examiner*—Jon Santamauro
*Attorney, Agent, or Firm*—Foley & Lardner

[57] ABSTRACT

A semiconductor integrated circuit having a field effect transistor formed on a compound semiconductor is disclosed, that comprises a first power supply, a second power supply for supplying a voltage lower than a voltage that the first power supplies, and at least one virtual power supply that is not connected to the outside and that has a voltage between the voltage of the first power supply and the voltage of the second power supply, wherein the number of the virtual power supplies is designated to a value larger than the quotient of which the voltage between the first power supply and the second power supply is divided by the forward turn-on voltage of a gate electrode of the field effect transistor. In the case that a signal received from a circuit with a low voltage is connected to a circuit between any power supply, the signal is received by a directly coupled logic circuit with a depletion type field effect transistor as a drive circuit. The threshold voltage of the depletion type field effect transistor is -ΔV or higher where ΔV is the voltage between each power supply.

8 Claims, 6 Drawing Sheets

F I G. 2
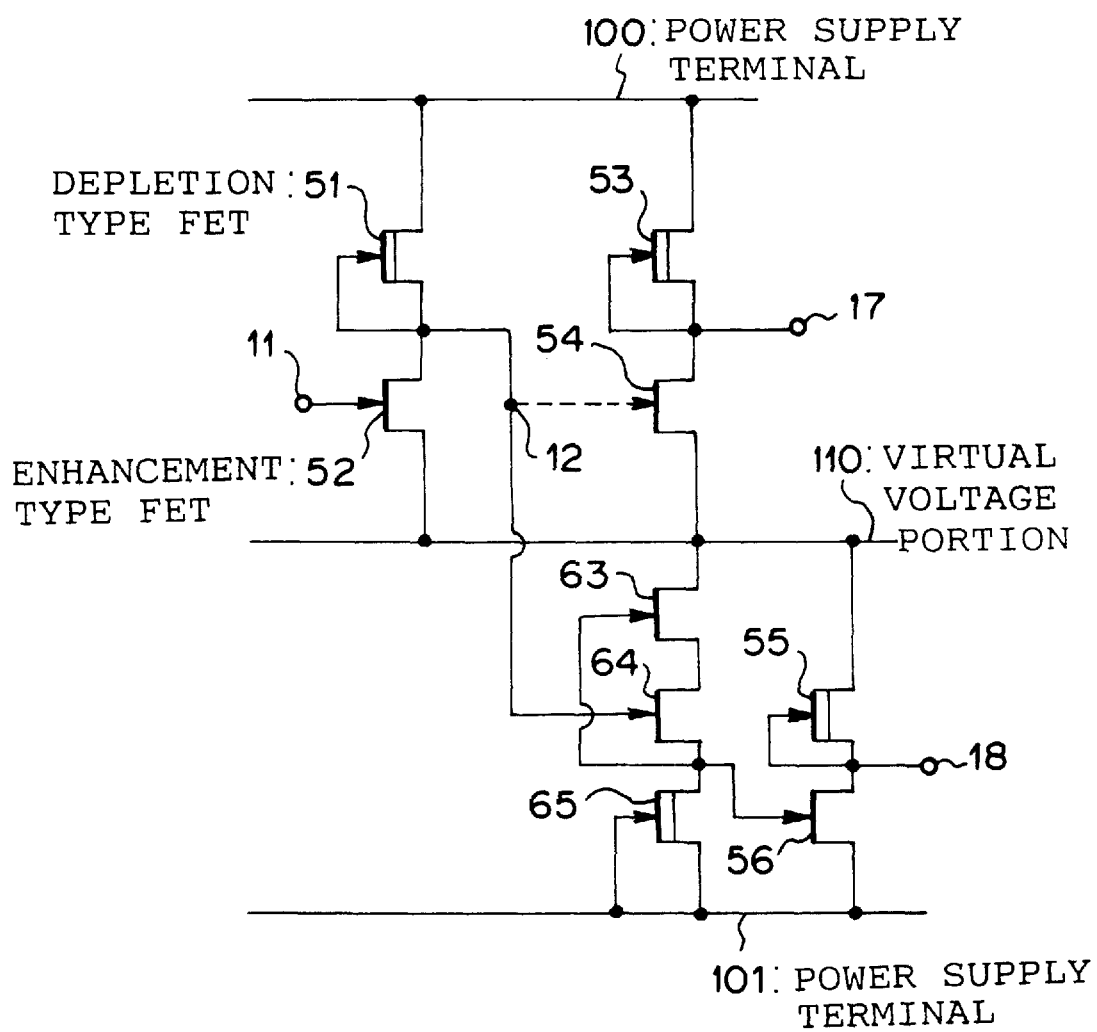

FETS LOGIC CIRCUIT

BACKGROUND OF THE INVENTION

1. Field of the Invention

The present invention relates to a logic circuit, particularly to a stack structure FETs logic circuit composed of field effect transistors that operates preferably at a voltage of 1 V or more and in ultra-high speed operation.

2. Description of the Related Art

The speed of electrons in a GaAs semiconductor is faster than that in a Si semiconductor by several times. Further, since a semi-insulating substrate can be easily manufactured, the parasitic capacitance of the circuit to be integrated can be reduced. With GaAs semiconductor devices, logic operations can be performed at a high speed. Thus, GaAs semiconductor devices have been intensively researched and developed in many laboratories in the world.

Among various basic circuit models of GaAs semiconductor devices, it is said that a direct coupled FET logic (hereinafter referred to as DCFL circuit) with an enhancement type field effect transistor (hereinafter referred to as FET) is simple structure and suitable for integration. In addition, the DCFL circuit does not require a high power supply voltage. With the DCFL circuit as a basic circuit, a gate array with an integration of 100 K gates has been commercially available.

As shown in FIG. 7, in the GaAs DCFL circuit, a drain electrode of a depletion type FET 51 used as a load is connected to a power supply terminal 100. A gate electrode and a source electrode of the depletion type FET 51 are connected to an output terminal 12. A drain electrode of an enhancement type FET 52 is connected to the output terminal 12. A gate electrode of the enhancement type FET 52 is connected to an input terminal 11. A source electrode of the enhancement type FET 52 is connected to a power supply terminal 101. The FETs 51 and 52 as inverters are followed by FETs 53 and 54 as inverters. Output signals of the FETs 53 and 54 are supplied from an output terminal 17.

When a voltage that is satisfactorily higher than the voltage of the source electrode of the FET 52 is supplied to the input terminal 11, a current flows in the enhancement type FET 52. Thus, the voltage at the output terminal 12 decreases. On the other hand, when a low voltage is supplied to the input terminal 11, no current flows in the enhancement type FET 52. Thus, the voltage at the output terminal 12 is maintained at a high voltage. Further, when the voltage at the output terminal 12 is a low voltage, the voltage at the output terminal 17 is a high level. In addition, when the voltage at the output terminal 12 is a high voltage, the voltage at the output terminal 17 is a low level.

Since the DCFL circuit shown in FIG. 7 is used along with an Si bipolar ECL (Emitter Coupled FET Logic) circuit, as a power supply voltage between the power supply terminal 100 and the power supply terminal 101, a negative power supply at −5.2 V, −4.5 V, −3.3 V, or −2.0 V is used.

On the other hand, the DCFL circuit composed of a compound semiconductor can operate at a high speed with a power supply voltage that is much lower than the above-described power supply voltage. In addition, when the DCFL circuit is operated at a power supply voltage that is higher than a gate forward turn-on voltage, a current flows from a gate Schottky electrode of the FET 54 of the next stage. This current does not contribute to driving the load, but a loss power of the circuit.

As a simplest and most effective means for decreasing the power consumption of the DCFL circuit, the power supply voltage is decreased. By setting the power supply voltage to the level lower than the Schottky barrier height of the FET, the current loss can be reduced. However, in this case, since a dedicated power supply for the GaAs DCFL circuit should be newly disposed in the system, this means is not practical.

As related art references that solve such a problem of the DCFL circuit and allow the power consumption to be reduced, for example Japanese Patent Laid-Open Publication Nos. 3-19422 and 6-104734 have been disclosed. In these related art references, logic circuits of which DCFL circuits are disposed in a plurality of stacking stages have been proposed.

In the conventional vertical stacking DCFL circuit shown in FIG. 5, a virtual voltage (virtual power supply terminal) 110 that is not connected to the outside is disposed between a power supply terminal 100 and a power supply terminal 101. The power supply terminal 100 is connected to the outside of the circuit. The voltage at the power supply terminal 100 is higher than the voltage at the power supply terminal 101. By operating a DCFL circuit between the power supply terminal 100 and the virtual power supply portion 110 or a DCFL circuit between the virtual power supply portion 110 and the power supply terminal 101, a current loss is re-used. Thus, the power consumption is reduced. As the DCFL circuit, FETs 53 and 54 as inverter circuits are used as a load of the output terminal 12. FETs 55 and 56 are used as a load of a level-shifting circuit.

In the circuit shown in FIG. 5, when a signal of a logic circuit that operates between the power supply terminal 100 and the virtual voltage portion 110 (this logic circuit is referred to as high voltage logic portion) is input to a logic circuit that operates between the virtual voltage portion 110 and the power supply terminal 101 (this logic circuit is referred to as low voltage logic portion), a level shifting circuit 21 shown in FIG. 5 is required.

Referring to FIG. 5, the level shifting circuit 21 is composed of for example an enhancement type FET 64, a diode 71, and a depletion type FET 65. In this circuit, the voltage of the input signal is lowered for the forward turn-on voltage of the diode 71.

In addition, to stabilize the virtual voltage portion 110, each of the voltage between the power supply terminal 100 and the virtual voltage portion 110 and the voltage between the virtual voltage portion 110 and the power supply terminal 101 is set to a higher voltage than the gate Schottky forward turn-on voltage of the FET. Thus, when a signal is connected from the high voltage logic portion to the low voltage logic portion, at least one diode is required. Consequently, the level shifting circuit 21 should be structured so that it operates between the power supply terminal 100 and the power supply terminal 101.

Since a current always flows in the level shifting circuit under a high voltage condition, the power consumption is large. Consequently, as the number of connections from the high voltage logic portion to the low voltage logic portion increases, the power consumption increases.

This applied to signal connections from the low voltage logic portion to the high voltage logic portion. As shown in FIG. 6, a level shifting circuit 22 composed of an enhancement type FET 64, a diode 71, and a depletion type FET 65 is required. In FIG. 6, FETs 58 and 67 as inverters are used for a level-shifted load. FETs 53 and 54 as inverters are used for a load of an output terminal 12.

The level shifting circuit 22 is structured by connecting at least one diode between a load DFET circuit and a drive FET so as to prevent the output voltage of the DCFL circuit from increasing to the voltage between the power supply terminal 100 and the power supply terminal 101. The output voltage swing of the output terminal 58 is decreased for the forward turn-on voltage of the diode 71.

However, since this circuit requires a high voltage, as the number of signal connections between the high voltage logic portion and the low voltage logic portion increases, the power consumption cannot be decreased.

SUMMARY OF THE INVENTION

The present invention is made from the above-described point of view. An object of the present invention is to provide a logic circuit that operates at high speed and that reduces the power consumption of an LSI.

To accomplish the above-described object, a first aspect of the present invention is a semiconductor integrated circuit having a field effect transistor formed on a compound semiconductor, comprising a first power supply, a second power supply for supplying a voltage lower than a voltage that the first power supplies, and at least one virtual power supply that is not connected to the outside and that has a voltage between the voltage of the first power supply and the voltage of the second power supply, wherein the number of the virtual power supplies is designated to a value larger than or equal to the quotient of the voltage between the first power supply and the second power supply divided by the forward turn-on voltage of a gate electrode of the field effect transistor less any remainder.

A second aspect of the present invention is a logic circuit composed of a semiconductor integrated circuit having a field effect transistor formed on a compound semiconductor, comprising a first power supply, a second power supply for supplying a voltage lower than a voltage that the first power supplies, at least one virtual power supply that is not connected to the outside and that has a voltage between the voltage of the first power supply and the voltage of the second power supply, the number of the virtual power supplies being designated to a value larger than or equal to the quotient of the voltage between the first power supply and the second power supply divided by the forward turn-on voltage of a gate electrode of the field effect transistor, less any remained and a circuit that operates between each power supply that supplies a voltage lower than the voltage of the first power supply, wherein in the case that a signal received from a circuit with a low voltage is connected to a circuit between any power supply, the signal is received by a direct coupled type logic circuit with a depletion type field effect transistor as a drive circuit. In this case, the threshold voltage of the depletion type field effect transistor is $-\Delta V$ or higher where $\Delta V$ is the voltage between each power supply.

A third aspect of the present invention is a logic circuit composed of a semiconductor integrated circuit having a field effect transistor formed on a compound semiconductor, comprising a first power supply, a second power supply for supplying a voltage lower than a voltage that the first power supplies, at least one virtual power supply that is not connected to the outside and that has a voltage between the voltage of the first power supply and the voltage of the second power supply, the number of the virtual power supplies being designated to a value larger than or equal to the quotient of the voltage between the first power supply and the second power supply divided by the forward turn-on voltage of a gate electrode of the field effect transistor, less any remainder and a circuit that operates between each power supply that supplies a voltage lower than the voltage of the first power supply, wherein in the case that a signal received from a circuit with a high voltage is connected to any power supply, the signal is received by a circuit composed of a first enhancement type field effect transistor and a second enhancement type field effect transistor, a drain electrode of the first enhancement type field effect transistor being connected to a high voltage terminal disposed between the power supplies, a gate electrode thereof being connected to a first output terminal, a source electrode thereof being connected to a first node, a drain electrode of the second enhancement type field effect transistor being connected to the first node, a gate thereof being connected to the first input terminal (node 12 in FIG. 2), a source electrode thereof being connected to the first output terminal, one terminal of the circuit being connected to the first output terminal, the other terminal thereof being connected to a low voltage terminal disposed between the power supplies.

A fourth aspect of the present invention is a logic circuit composed of a semiconductor integrated circuit having a field effect transistor formed on a compound semiconductor, comprising a first power supply, a second power supply for supplying a voltage lower than a voltage that the first power supplies, at least one virtual power supply that is not connected to the outside and that has a voltage between the voltage of the first power supply and the voltage of the second power supply, the number of the virtual power supplies being designated to a value larger than or equal to the quotient of the voltage between the first power supply and the second power supply divided by the forward turn-on voltage of a gate electrode of the field effect transistor, less any remainder an enhancement type field effect transistor, a drain electrode thereof being connected to a high voltage power supply terminal disposed between the power supplies, a gate electrode thereof being connected to a first node, a source electrode thereof being connected to a low voltage terminal disposed between the power supplies so as to stabilize the voltage of the virtual power supply, a first resistor element, one terminal thereof being connected to the high voltage power supply terminal, the other terminal thereof being connected to the first node, and a second resistor element, one terminal being connected to the first node, the other terminal thereof being connected to the low voltage power supply terminal, wherein the values of the first and second resistor elements are designated so that the voltage at the first node becomes the threshold voltage of the enhancement type field effect transistor.

Next, the theory of the present invention will be described.

In the logic circuit of the first aspect of the present invention, the number of virtual voltage supplies between the first power supply terminal and the second power supply terminal is designated to a value larger than or equal to the quotient of the voltage between the first power supply terminal and the second power supply terminal divided by the gate forward turn-on voltage of the field effect transistor less any remainder. Thus, the loss current that flows in the DCFL circuit is decreased.

In the logic circuit of the second aspect of the present invention, the number of virtual voltage supplies between the first power supply terminal and the second power supply terminal is designated to a value larger than or equal to the quotient of the voltage between the first power supply terminal and the second power supply terminal divided by the gate forward turn-on voltage of the field effect transistor less any remainder. Thus, the loss current that flows in the DCFL circuit is decreased. In addition, a signal from the low voltage logic portion to the high voltage logic portion is received by a directly coupled type logic circuit with a depletion type field effect transistor as a drive circuit. Thus, the level shifting circuit that increases the power consumption can be omitted.

Generally, the gate forward turn-on voltage of the GaAs FET is in the range from approximately 0.6 V to 0.8 V, assuming that the voltage between each power supply is ΔV, when the threshold voltage is designed to be −ΔV, a signal can be directly connected and coupled from the low voltage logic portion to the high voltage logic portion.

In the logic circuit of the third aspect of the present invention, the number of virtual voltage supplies between the first power supply terminal and the second power supply terminal is designated to a value larger than or equal to the quotient of the voltage between the first power supply terminal and the second power supply terminal divided by the gate forward turn-on voltage of the field effect transistor less any remainder. Thus, the loss current that flows in the DCFL circuit is decreased. With a circuit composed of first and second enhancement type FETs and depletion type FET that are cascode-connected, a signal can be directly connected from the high voltage logic portion to the low voltage logic portion.

In the cascode-connected circuit composed of the first and second enhancement type FETs, even if a input signal with a higher voltage than the power supply that drives the cascode-connected circuit, since each source voltage is fed back, the output voltage can be converted into the voltage corresponding to the power supply.

In the logic circuit of the fourth aspect of the present invention, resistors are connected in serial between the first power supply terminal and the virtual voltage supply and between the virtual voltage supply and the second power supply terminal. The divided output of the resistors is connected to the gate electrode of an enhancement type FET. The enhancement type FET is connected between power supplies. Thus, the virtual voltage used in the above-described logic circuit can be stabilized.

When the divided output of the resistors is designed to the threshold value of the connected FET in the state that the voltage between the power supplies does not fluctuate, if the current between the first power supply terminal and the virtual voltage supply and between the virtual voltage supply and the second power supply terminal decreases and thereby the voltage therein rises, the voltage at the divided output of the resistors also rises. The connected FET causes a current that decreases to increase, thereby stabilizes the voltage. In contrast, when the current increases, since the voltage at the divided output of the resistors drops, thereby decreasing the current of the FET and stabilizing the voltage.

These and other objects, features and advantages of the present invention will become more apparent in light of the following detailed description of a best mode embodiment thereof, as illustrated in the accompanying drawings.

BRIEF DESCRIPTION OF DRAWINGS

FIG. 2 is a circuit diagram showing a second embodiment of the present invention;

DESCRIPTION OF PREFERRED EMBODIMENTS

Figure 1:
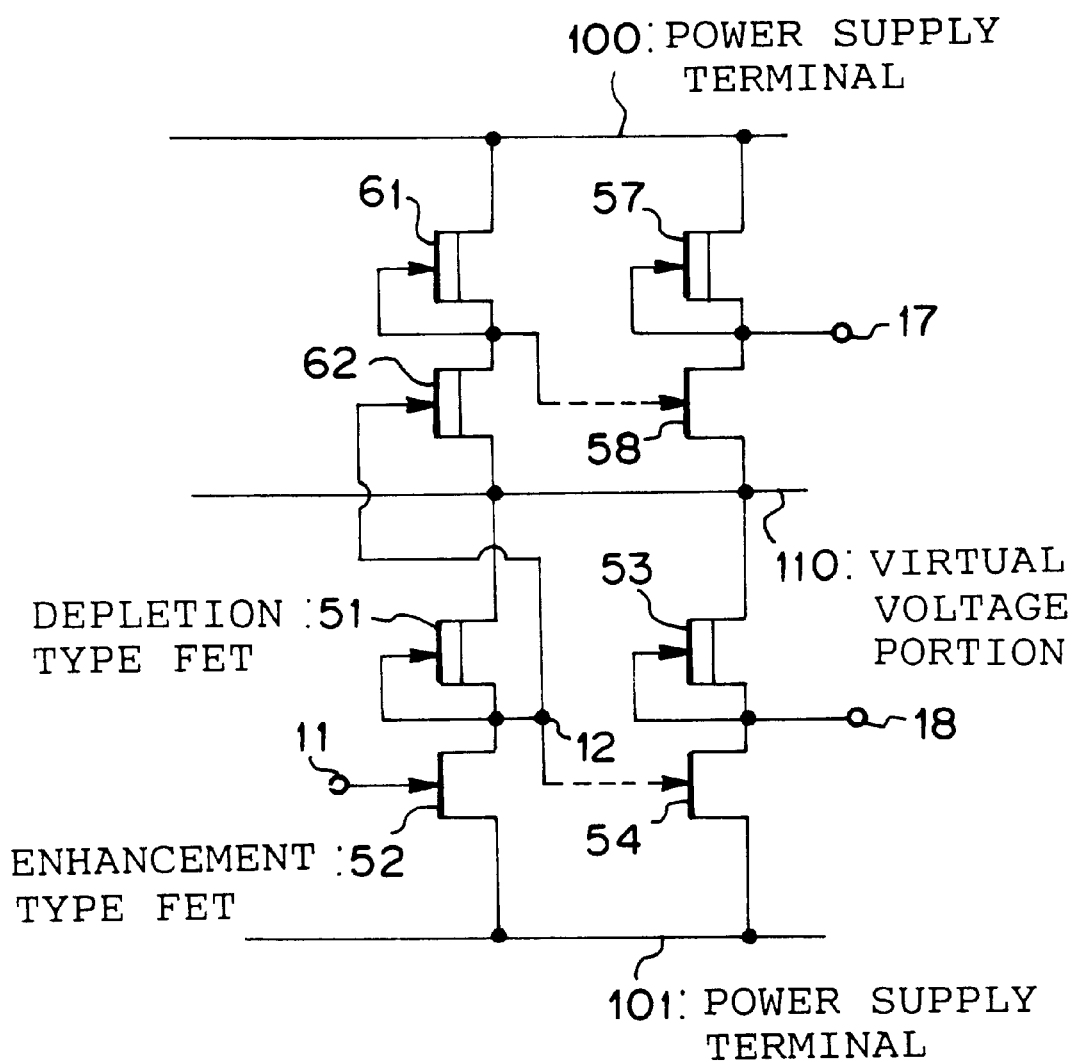
FIG. 1 is a circuit diagram showing a first embodiment of the present invention.

Next, with reference to the accompanying drawings, an embodiment of the present invention will be described in detail. FIG. 1 is a circuit diagram for explaining a logic circuit corresponding to an embodiment of the present invention.

In this embodiment, a structure having an ideal (virtual) voltage portion 110 that is not connected to the outside and that is disposed between a power supply terminal 100 and a power supply terminal 101 will be described. The voltage at the power supply terminal 101 is lower than the voltage at the power supply terminal 100.

Figure 6:
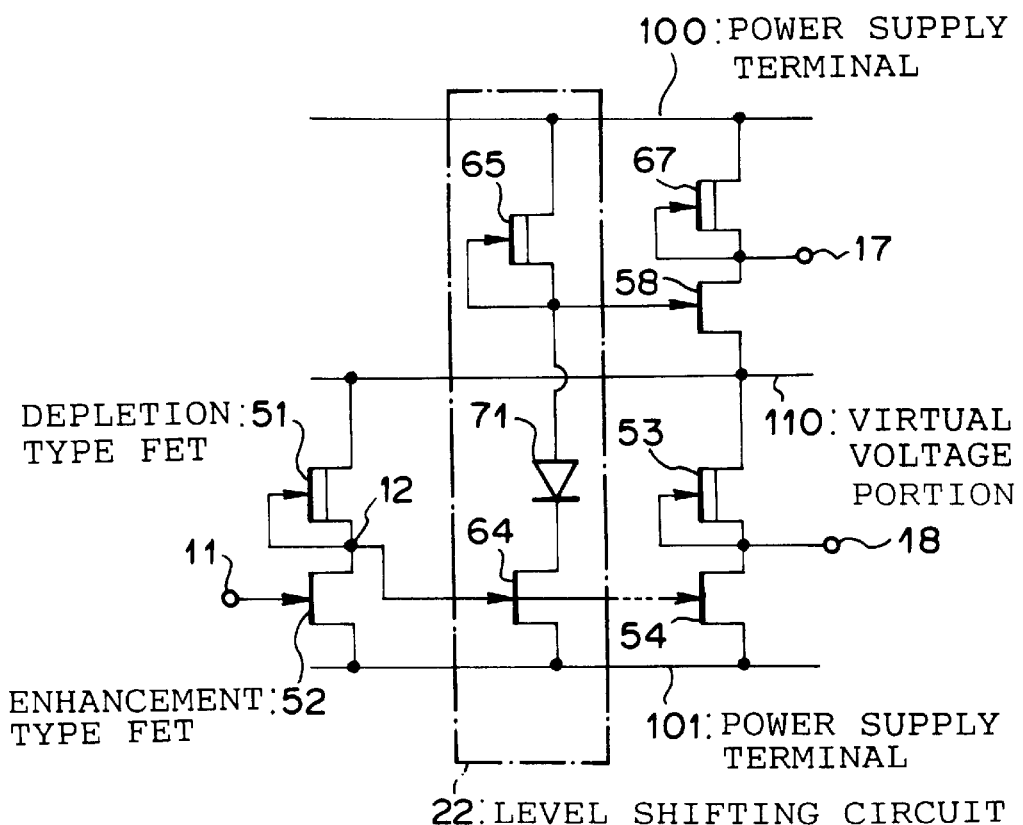
FIG. 6 is a circuit diagram showing another conventional logic circuit.
Figure 7:
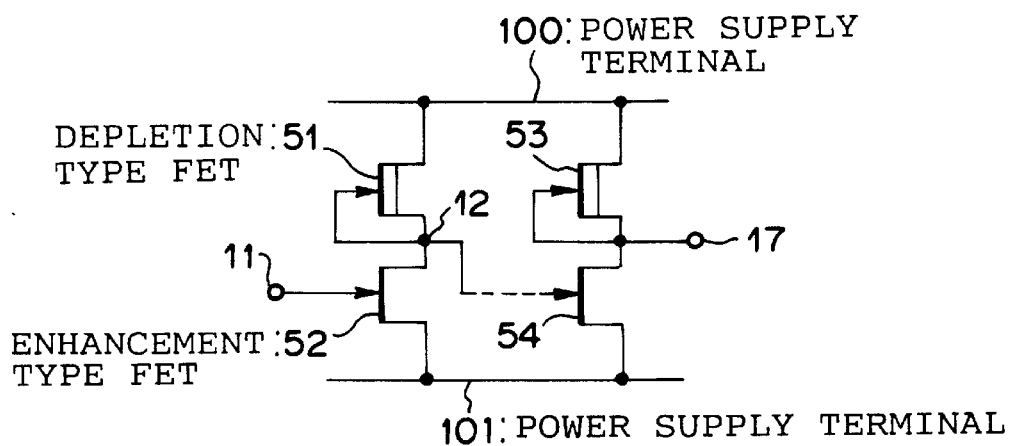
FIG. 7 is a circuit diagram for explaining a conventional DCFL logic circuit.

Each of a high voltage logic circuit disposed between the power supply terminal 100 connected to the outside and the virtual voltage portion 110 and a low voltage logic circuit disposed between the virtual voltage portion 110 and the power supply terminal 101 is composed of a DCFL circuit. The DCFL circuit is composed of a depletion type FET as a load device and an enhancement type FET as a drive device. The DCFL circuit is composed of for example a depletion type FET 51 and an enhancement type FET 52. In FIG. 1, similar portions to those in FIG. 6 are denoted by similar reference numerals.

In this embodiment, the power supply terminal 100 is connected to a power supply of for example +1 V. The power supply terminal 101 is grounded. The voltage between these terminals is 1 V. On the other hand, since the gate forward turn-on voltage of the enhancement type FET is around in the range from 0.6 to 0.8 V, the required number of virtual voltages between the power supply terminals 100 and 101 is "1". At this point, since each of the voltage between the power supply terminal 100 and the virtual voltage portion 110 and the voltage between the virtual voltage portion 110 and the power supply terminal 101 becomes 0.5 V, the loss current that flows in the gate electrode of the DCFL circuit decreases.

Next, the case that a signal that is supplied to an output terminal 12 of the low voltage logic portion is connected to the high voltage logic portion will be described.

The high level of the output voltage of the DCFL circuit composed of the depletion type FET 51 and the enhancement type FET 52 in the low voltage logic circuit is 0.5 V, whereas the low level thereof is approximately 0 V. To turn on/off the circuit of the high voltage logic portion in the output level, the drive FET 62 of the DCFL circuit to which this signal is supplied should be a depletion type FET. At this point, assuming that the threshold voltage of the FET 62 is −0.4 V, since the threshold voltage of the FET 61 is −0.4 V, the signal can be satisfactorily connected to the high voltage logic portion. The output signal of the output terminal 12 is level-shifted and supplied to the gate electrode of the FET 58. A digital output signal of for example 0.5 V/1.0 V is obtained to the output terminal 17. On the other hand, the output signal of the output terminal 12 can be connected to FETs 54 and 53 as inverters. Thus, a digital output signal of for example 0.0 V/0.5 V can be obtained to the output terminal 18.

FIG. 2 is a circuit diagram showing the structure of a logic circuit according to another embodiment of the present invention.

In this embodiment, a power supply terminal 100 is connected to a power supply of +1 V. A power supply terminal 101 is grounded. Thus, the voltage between the two power supply terminals 100 and 101 is 1 V. Consequently, as with the embodiment shown in FIG. 1, the current loss can be decreased.

Next, the case that a signal that is supplied to an output terminal 12 of a high voltage logic portion is connected to a low voltage logic portion will be described.

The high level of the output portion 12 of a DCFL circuit composed of the depletion type FET 51 and the enhancement type 52 is 1.0 V, whereas the low level of the output portion 12 thereof is approximately 0.5 V. To turn on/off the low voltage logic circuit in the output levels, the circuit to which the signal is supplied is connected to a circuit composed of enhancement type FETs 63 and 64 and depletion type FET 65 that are cascode-connected. Thus, the signal can be directly connected from the high voltage logic circuit to the low voltage logic circuit.

In the cascode-connected circuit composed of the enhancement type FETs 63 and 64, when a signal with a voltage higher than a voltage of the cascode-connected circuit is input thereto, since the source voltages thereof are fed back. Thus, the output voltage can be converted into the voltage corresponding to the power supply. In other words, when a digital value of 0.5 V/1.0 V is input to the gate electrode of the FET 64, the resistance between the drain electrode and source electrode of the FET 64 increases/decreases corresponding to the voltage. Further, the FET 63 operates as a constant current source, a output voltage of 0.0 V/0.5 V is obtained to the source electrode of the FET 64. That is, the input voltage is shifted. Incidentally, the FETs 54 and 53 and the FETs 56 and 55 as a load of the circuit function as inverters.

Figure 3:
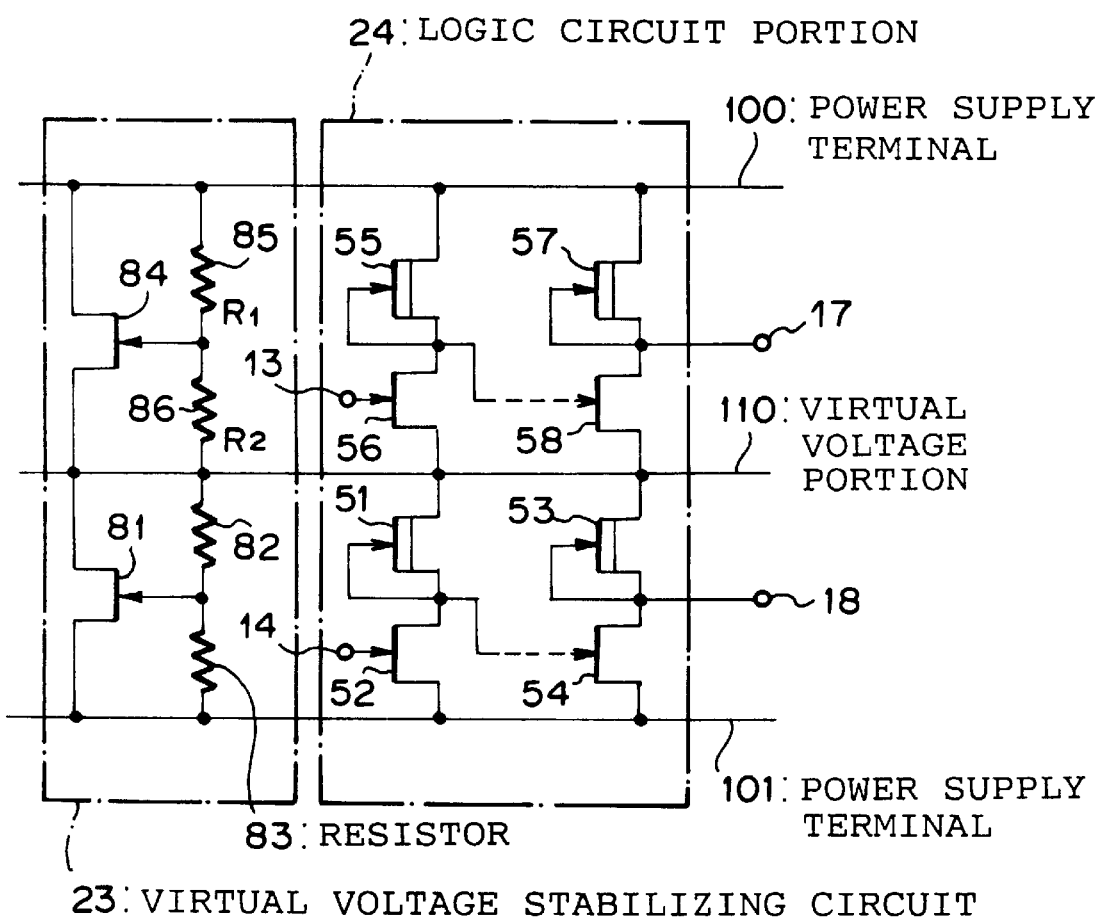
FIG. 3 is a circuit diagram showing a third embodiment of the present invention.

FIG. 3 is a schematic diagram showing a logic circuit according to another embodiment of the present invention. In this embodiment, resistors 85 and 86 are connected in series between a power supply terminal 100 and a virtual voltage portion 110. The divided output of the resistors 85 and 86 is connected to the gate electrode of an enhancement type FET 84. The drain electrode of the enhancement type FET 84 is connected to the power supply terminal 100. The source electrode of the enhancement type FET 84 is connected to the virtual voltage portion 110.

In this embodiment, the power supply terminal 100 is supplied to a power supply voltage of +1 V. The power supply terminal 101 is grounded. Assuming that the high resistance of the resistor 85 is R1 and the high resistance of the resistor 86 is R2, the threshold voltage Vt of the enhancement type FET 84 between the gate electrode and source electrode of the enhancement type FET 84 is designated so that the following formula (1) is satisfied.

$$Vt=0.5 \{R2/(R1+R2)\} \quad (1)$$

The threshold voltage Vt satisfies the conditions that the voltage between the power supplies does not fluctuate and that no current flows in the enhancement type FET 84.

When the current that flows between the power supply terminal 100 and the virtual voltage portion 110 decreases and the voltage thereof increases, the voltage at the divided output of the resistors 85 and 86 also rises. The connected enhancement type FET 84 flows the current of the insufficiency, thereby stabilizing the voltage of the virtual voltage portion 110. In contrast, when the current that flows between the power supply terminal 100 and the virtual voltage portion 110 increases and the voltage thereof decreases, since the voltage of the divided output of the resistors 85 and 86 decreases, the enhancement type FET 84 causes the current that is weakened to decrease, thereby stabilizing the voltage of the virtual voltage portion 110.

Since an FET 81 and resistors 82 and 83 disposed in the low voltage logic portion function in the same manner as the resistors 85 and 86 and the enhancement type FET 84 disposed in the high voltage logic portion, the voltage fluctuation of each designated voltage of the voltage between the power supply terminal 100 and the virtual voltage portion 110 and between the virtual voltage portion 110 and the power supply terminal 101 can be fed back. Thus, the virtual voltage becomes stable.

Referring to FIG. 3, a logic circuit portion 24 that is stabilized the virtual voltage by a virtual voltage stabilizing circuit 23 forms a DCFL circuit. An input signal supplied to an input terminal 13 is supplied to a two-staged buffer circuit. The two-staged buffer circuit is composed of enhancement type FETs 56 and 58 and depletion type FETs 55 and 57 that are cascode-connected. An output signal of the two-staged buffer circuit is supplied to an output terminal 17. Likewise, an input signal supplied to an input terminal 14 is supplied to a two-staged buffer circuit. The two-staged buffer circuit is composed of enhancement type FETs 52 and 54 and depletion type FETs 51 and 58 that are cascode-connected. An output signal of the two-staged buffer circuit is supplied to an output terminal 18. It should be noted that these logic circuits are only examples. Thus, another logic circuit is connected as a load, the virtual voltage is stabilized in a constant level.

Figure 4:
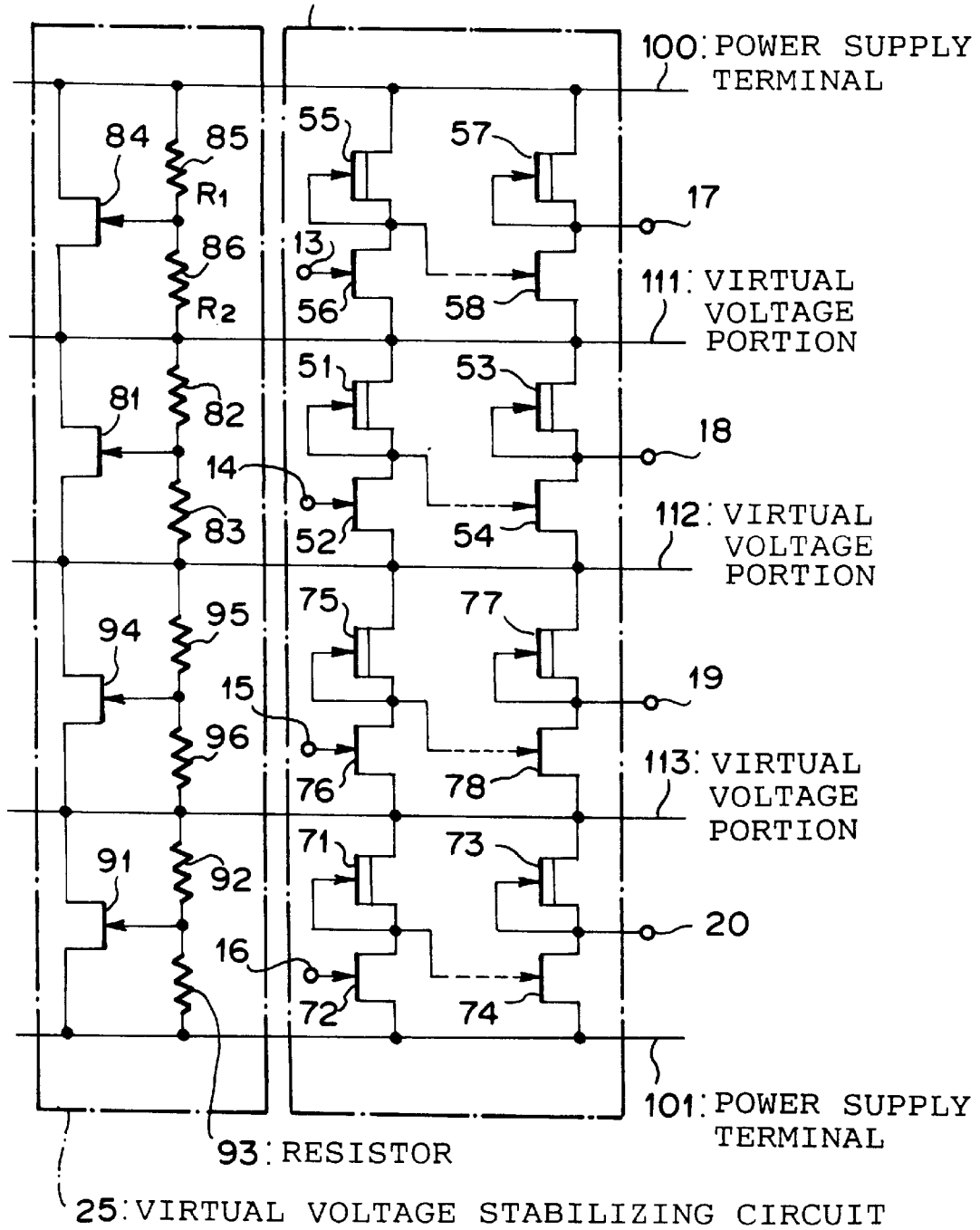
FIG. 4 is a circuit diagram showing a fourth embodiment of the present invention.
Figure 5:
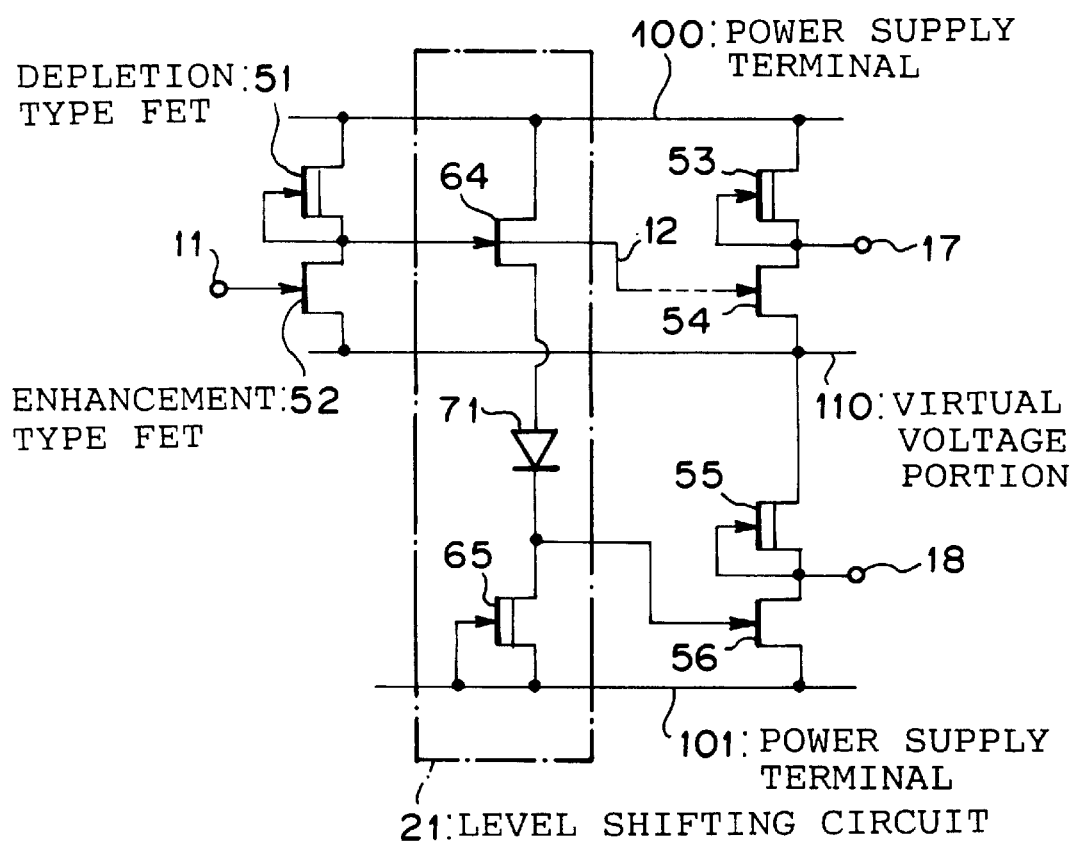
FIG. 5 is a circuit diagram showing a conventional logic circuit.

FIG. 4 is a schematic diagram showing the structure of a logic circuit according to another embodiment of the present invention. In this embodiment, three virtual voltages portion 111 to 113 are disposed between power supply terminals 100 and 101. As a virtual voltage stabilizing circuit, four-stage virtual voltage stabilizing circuits with the structure shown in FIG. 3 are connected to four columns. In the first stage, resistors 85 and 86 are connected in series between the power supply terminal 100 and the virtual voltage portion 111. The divided output of the resistors 85 and 86 is input to the gate electrode of the enhancement type FET 84. The drain electrode of the enhancement type FET 84 is connected to the power supply terminal 100. The source electrode of the enhancement type FET 84 is connected to the virtual voltage portion 111.

Likewise, in the second stage, resistors 82 and 83 are connected in series between the virtual voltages portion 111 and 112. The divided output of the resistors 82 and 83 is connected to the gate electrode of the enhancement type FET 81. The drain electrode of the enhancement type FET 81 is connected to the virtual voltage portion 111. The source electrode of the enhancement type FET 81 is connected to the virtual voltage portion 112. In the third stage, resistors 95 and 96 are connected in series between the virtual voltage portions 112 and 113. The divided output of the resistors 95 and 96 is connected to the gate electrode of the enhancement type FET 94. The drain electrode of the enhancement type FET 94 is connected to the virtual voltage portion 112. The source electrode of the enhancement type FET 94 is connected to the virtual voltage portion 113. In the fourth stage, resistors 92 and 93 are connected in series between the virtual voltage portion 113 and the power supply terminal 101. The divided output of the resistors 92 and 93 is connected to the gate electrode of the enhancement type FET 91. The drain electrode of the enhancement type FET 91 is connected to the virtual voltage portion 113. The source electrode of the enhancement type FET 91 is connected to the power supply terminal 101.

The operation of the virtual voltage stabilizing circuit 25 shown in FIG. 4 is the same as that of the circuit shown in FIG. 3. For example, when a voltage of 2.0 V is supplied between the power supply terminals 100 and 101, the voltage between the power supply terminal 100 and the virtual voltage portion 111, the voltage between the virtual voltage portions 111 and 112, the voltage between the virtual voltage portions 112 and 113, and the voltage between the virtual voltage portion 113 and the power supply terminal 101 are stabilized at 0.5 V.

As with the logic circuit shown in FIG. 3, a logic circuit 26 as a load of the virtual voltage stabilizing circuit 25 is composed of FETs 55 to 58, FETs 51 to 54, FETs 75 to 78, FETs 71 to 74, input terminals 13 to 16, and output terminals 17 to 20. The virtual voltage stabilizing circuit 25 stabilizes each virtual voltage of the three virtual voltage portions 111 to 113 corresponding to the state of the load of the logic circuit 26. When voltages ranging from 1.5 V to 2.0 V, 1.0 V to 1.5 V, 0.5 V to 1.0 V, and 0.0 V to 0.5 V are supplied to the input terminals 13 to 16, voltages ranging from 1.5 V to 2.0 V, 1.0 V to 1.5 V, 0.5 V to 1.0 V, and 0.0 V to 0.5 V are obtained to the output terminals 17 to 20, respectively.

With the voltage shifting circuit shown in FIGS. 1 and 2, in the embodiment shown in FIG. 4, a logic circuit that is connected in a plurality of stages can be structured.

When the number of virtual voltages is "n", in the case that the voltage between the power supply terminals shown in FIGS. 1 to 3 is 3 V, assuming that n=5, each virtual voltage of the virtual voltage portions can be stabilized. The voltage shifting operation of the load between each power supply voltage can be performed by the similar means so as to accomplish the object of the present invention.

Thus, when the logic circuit according to each embodiment of the present invention is used as a basic circuit of an LSI, it can operate at a high speed with a low power supply voltage. Therefore, the power consumption can be decreased. Without a sacrifice of the operation speed of the LSI, the power consumption can be reduced by nearly 1/10 times. Thus, when the present invention is applied for a future EWS (Engineering Work Station) and an ultra-super computer, their performances can be remarkably improved.

As described in the embodiment shown in FIG. 4, even if the number of virtual voltages is increased, the same operation and effect as the structure with one virtual voltage can be obtained.

As described above, according to the first aspect of the present invention, since the number of virtual voltages disposed between power supply terminals connected to the outside is designated to a value larger than or equal to the quotient of the voltage between the external terminals divided by the forward turn-on voltage of the gate electrode of a field effect transistor, less any remainder the loss current that flows in the DCFL circuit can be decreased.

According to the second aspect of the present invention, the number of virtual voltages is designated so that the loss current that flows in the DCFL circuit is decreased. In addition, since a signal supplied from the low voltage logic portion to the high voltage logic portion is connected by a directly coupled type logic circuit with a depletion type field effect transistor as a drive device, a level shifting circuit that consumes a large amount of power can be omitted.

According to the third aspect of the present invention, the number of virtual voltages is designated so that the loss current that flows in the DCFL circuit is decreased. In addition, a signal can be directly connected from the high voltage logic portion to the low voltage logic portion with a circuit composed of an enhancement type FET and a depletion type FET that are cascode-connected.

According to the fourth aspect of the present invention, resistors that are connected in series are disposed between virtual voltages. The divided output of the resistors is connected to the gate electrode of an enhancement type FET connected between power supply terminals. Thus, the virtual voltage used in the logic circuit can be stabilized.

Thus, when the logic circuit according to each embodiment of the present invention is used as a basic circuit of an LSI, it can operate at a high speed with a low power supply voltage. Thus, the power consumption can be decreased. Without a sacrifice of the operation speed of the LSI, the power consumption can be reduced by nearly 1/10 times. Therefore, when the present invention is applied for a future EWS and an super computer, their performances can be remarkably improved.

Although the present invention has been shown and described with respect to a best mode embodiment thereof, it should be understood by those skilled in the art that the foregoing and various other changes, omissions, and additions in the form and detail thereof may be made therein without departing from the spirit and scope of the present invention.

What is claimed is:

1. A semiconductor integrated circuit having a field effect transistor formed on a compound semiconductor, comprising:

a first power supply;

a second power supply for supplying a voltage lower than a voltage that said first power supply supplies;

at least one virtual power supply that is not connected to the outside and that has a voltage between the voltage of said first power supply and the voltage of said second power supply, wherein the number of said virtual power supplies is larger than or equal to the quotient of the voltage between said first power supply and said second power supply divided by the forward turn-on voltage of a gate electrode of the field effect transistor, less any remainder.

2. A logic circuit composed of a semiconductor integrated circuit having a field effect transistor formed on a compound semiconductor, comprising:

a first power supply;

a second power supply for supplying a voltage lower than a voltage that said first power supply supplies;

at least one virtual power supply that is not connected to the outside and that has a voltage between the voltage of said first power supply and the voltage of said second power supply, the number of said virtual power supplies being larger than or equal to the quotient of the voltage between said first power supply and said second power supply divided by the forward turn-on voltage of a gate electrode of the field effect transistor, less any remainder; and a circuit that operates between each power supply that supplies a voltage lower than the voltage of said first power supply, wherein in the case that a signal received from a circuit with a low voltage is connected to a circuit between any power supply, the signal is received by a directly coupled logic circuit with a depletion type field effect transistor as a drive circuit.

3. A logic circuit composed of a semiconductor integrated circuit having a field effect transistor formed on a compound semiconductor, comprising:

a first power supply;

a second power supply for supplying a voltage lower than a voltage that said first power supply supplies;

at least one virtual power supply that is not connected to the outside and that has a voltage between the voltage of said first power supply and the voltage of said second power supply, the number of said virtual power supplies being larger than or equal to the quotient of the voltage between said first power supply and said second power supply divided by the forward turn-on voltage of a gate electrode of the field effect transistor, less any remainder; and a circuit that operates between each power supply that supplies a voltage lower than the voltage of said first power supply, wherein in the case that a signal received from a circuit of high voltage logic portion is connected to any power supply, the signal is received by a circuit composed of a first enhancement type field effect transistor and a second enhancement type field effect transistor, a drain electrode of the first enhancement type field effect transistor being connected to a high voltage terminal disposed between the power supplies, a gate electrode thereof being connected to a first output terminal, a source electrode thereof being connected to a first node, a drain electrode of the second enhancement type field effect transistor being connected to the first node, a gate thereof being connected to the first output terminal, a source electrode thereof being connected to the first input terminal, one terminal of the circuit being connected to the first output terminal, the other terminal thereof being connected to a low voltage terminal disposed between the power supplies.

4. A logic circuit composed of a semiconductor integrated circuit having a field effect transistor formed on a compound semiconductor, comprising:

a first power supply;

a second power supply for supplying a voltage lower than a voltage that said first power supply supplies;

at least one virtual power supply that is not connected to the outside and that has a voltage between the voltage of said first power supply and the voltage of said second power supply, the number of said virtual power supplies being larger than or equal to the quotient of the voltage between said first power supply and said second power supply divided by the forward turn-on voltage of a gate electrode of the field effect transistor, less any remainder;

an enhancement type field effect transistor, a drain electrode thereof being connected to a high voltage power supply terminal disposed between the power supplies, a gate electrode thereof being connected to a first node, a source electrode thereof being connected to a low voltage terminal disposed between the power supplies so as to stabilize the voltage of said virtual power supply;

a first resistor element, one terminal thereof being connected to the high voltage power supply terminal, the other terminal thereof being connected to the first node; and a second resistor element, one terminal being connected to the first node, the other terminal thereof being connected to the low voltage power supply terminal, wherein the values of the first and second resistor elements are designated so that the voltage at the first node becomes the threshold voltage of the enhancement type field effect transistor.

5. The logic circuit as set forth in claim 2, wherein the threshold voltage of the depletion type field effect transistor is $-\Delta V$ or higher where $\Delta V$ is the voltage between each power supply.

6. A logic circuit composed of a semiconductor integrated circuit having a field effect transistor formed on a compound semiconductor, comprising:

at least one virtual power supply disposed between a first power supply and a second power supply, the voltage of the second power supply being lower than the voltage of the first power supply, the virtual power supply being not connected to the outside, the voltage between the first power supply and the at least one virtual power supply and the voltage between the second power supply and the at least one virtual power supply each not exceeding the forward turn-on voltage of the field effect transistor.

7. The logic circuit as set forth in claim 6, wherein in the case that an output signal of a low voltage logic circuit is supplied to a high voltage logic circuit, the output signal of the low voltage logic circuit is received by a directly coupled type logic circuit with a depletion type field effect transistor as a drive circuit, the directly coupled logic circuit being disposed between a virtual power supply on the high voltage side of the low voltage logic circuit and a higher voltage virtual power supply or the first power supply and supplied to the logic circuit on the high voltage side.

8. The logic circuit as set forth in claim 6, wherein in the case that an output signal of a high voltage logic portion is supplied to a low voltage logic circuit, the output signal of the high voltage logic circuit is input to the low voltage logic circuit through an enhancement type field effect transistor and a depletion type field effect transistor that are disposed between a virtual power supply on the low voltage side of the high voltage logic circuit and a lower voltage virtual power supply or the second power supply and that are cascode-connected.

* * * * *